United States Patent
Fritzsche et al.

(10) Patent No.: US 10,456,870 B2
(45) Date of Patent: Oct. 29, 2019

(54) METHOD FOR PRODUCING A SOLDERED CONNECTION

(71) Applicant: Heraeus Deutschland GmbH & Co. KG, Hanau (DE)

(72) Inventors: Sebastian Fritzsche, Hanau (DE); Jürgen Schulze, Potsdam (DE); Jörg Trodler, Königs Wusterhausen (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 166 days.

(21) Appl. No.: 15/506,456

(22) PCT Filed: Aug. 21, 2015

(86) PCT No.: PCT/EP2015/069222
§ 371 (c)(1),
(2) Date: Feb. 24, 2017

(87) PCT Pub. No.: WO2016/030287
PCT Pub. Date: Mar. 3, 2016

(65) Prior Publication Data
US 2017/0252869 A1 Sep. 7, 2017

(30) Foreign Application Priority Data
Aug. 27, 2014 (EP) .................... 14182454

(51) Int. Cl.
| B23K 35/26 | (2006.01) |
| H01L 23/00 | (2006.01) |
| C22C 9/00 | (2006.01) |
| B23K 35/02 | (2006.01) |
| B23K 35/30 | (2006.01) |
| B23K 35/362 | (2006.01) |
| H05K 3/34 | (2006.01) |

(52) U.S. Cl.
CPC ........ *B23K 35/025* (2013.01); *B23K 35/0244* (2013.01); *B23K 35/262* (2013.01); *B23K 35/302* (2013.01); *B23K 35/362* (2013.01); *H01L 24/27* (2013.01); *H01L 24/29* (2013.01); *H01L 24/83* (2013.01); *H05K 3/3484* (2013.01); *H01L 2224/293* (2013.01); *H01L 2224/29294* (2013.01); *H01L 2224/29347* (2013.01); *H01L 2224/8384* (2013.01); *H01L 2224/83815* (2013.01)

(58) Field of Classification Search
None
See application file for complete search history.

(56) References Cited

U.S. PATENT DOCUMENTS

| 4,448,852 A * | 5/1984 | Bose ................. B23K 35/0233 148/403 |
| 5,221,038 A * | 6/1993 | Melton ................ B23K 1/0016 228/180.22 |
| 5,378,294 A * | 1/1995 | Rissanen .............. B23K 35/302 148/433 |
| 5,540,379 A * | 7/1996 | Kazem-Goudarzi ....................... B23K 35/0244 228/227 |
| 7,461,770 B2 * | 12/2008 | Hartmann ................ C22C 9/02 228/246 |
| 2003/0096493 A1 * | 5/2003 | Vandermeulen ........................... H01L 23/49816 438/612 |
| 2006/0113683 A1 * | 6/2006 | Dean ....................... C22C 11/00 257/783 |
| 2007/0172381 A1 * | 7/2007 | Deram ................. B23K 35/262 420/561 |
| 2007/0278456 A1 | 12/2007 | Sakai et al. |
| 2012/0119392 A1 * | 5/2012 | Breer ................... B23K 1/0016 257/782 |
| 2013/0042912 A1 * | 2/2013 | Kurihara .............. B23K 35/262 136/256 |

(Continued)

FOREIGN PATENT DOCUMENTS

| CN | 1615201 A | 5/2005 |
| CN | 1943030 A | 4/2007 |

(Continued)

OTHER PUBLICATIONS

Int'l Search Report and Written Opinion dated Sep. 29, 2015 in Int'l Application No. PCT/EP2015/069222.

(Continued)

*Primary Examiner* — Devang R Patel
(74) *Attorney, Agent, or Firm* — Panitch Schwarze Belisario & Nadel LLP

(57) ABSTRACT

A method for making a firmly-bonded connection involves a) providing an electronic component and a substrate having surfaces to be connected; b) applying a copper paste onto at least one of the surfaces and drying the layer of copper paste; c1) applying a solder agent onto the copper paste and arranging the component and the substrate in contact via the combination of copper paste and solder agent; or c2) arranging the component and the substrate in contact via the dried copper paste, and applying a solder agent next to the layer of dried copper paste; and d) soldering the arrangement. The copper paste contains (i) particles of copper, copper-rich copper/zinc alloy, and/or copper-rich copper/tin alloy containing a phosphorus fraction of 0 to ≤500 wt-ppm, (ii) solder particles which are tin, tin-rich tin/copper alloy, tin-rich tin/silver alloy, and/or tin-rich tin/copper/silver alloy, and (iii) vehicle.

15 Claims, No Drawings

(56) References Cited

U.S. PATENT DOCUMENTS

| | | | |
|---|---|---|---|
| 2013/0045131 A1* | 2/2013 | Li | B23K 35/282 |
| | | | 420/516 |
| 2013/0140069 A1* | 6/2013 | Kitajima | H01B 1/22 |
| | | | 174/257 |
| 2016/0129530 A1* | 5/2016 | Greve | B23K 35/025 |
| | | | 75/228 |

FOREIGN PATENT DOCUMENTS

| | | |
|---|---|---|
| CN | 1977368 A | 6/2007 |
| CN | 101081462 A | 12/2007 |
| CN | 102470472 A | 5/2012 |
| CN | 103659053 A | 3/2014 |
| EP | 0 810 051 A1 | 12/1997 |
| EP | 1464431 A1 | 10/2004 |
| EP | 2 042 260 A2 | 4/2009 |
| EP | 2 158 997 A2 | 3/2010 |
| WO | 2005027198 A2 | 3/2005 |
| WO | 2011/009597 A1 | 1/2011 |

OTHER PUBLICATIONS

Office Action and Search Report dated Jun. 22, 2018 in CN Application No. 201580044881.X.

Office Action dated Jan. 16, 2019 in CN Application No. 201580044881.X.

* cited by examiner

METHOD FOR PRODUCING A SOLDERED CONNECTION

CROSS-REFERENCE TO RELATED APPLICATIONS

This application is a Section 371 of International Application No. PCT/EP2015/069222, filed Aug. 21, 2015, which was published in the German language on Mar. 3, 2016, under International Publication No. WO 2016/030287 A1 and the disclosure of which is incorporated herein by reference.

BACKGROUND OF THE INVENTION

The present invention relates to a method for firmly-bonded connection of an electronic component to a substrate, and to an arrangement that can be obtained in said method.

WO 2011/009597 A1 discloses a method for making firmly-bonded connection of an electronic component to a substrate, comprising a) providing an electronic component having a first surface to be connected and a substrate having a second surface to be connected, b) applying a solder paste to at least one of the surfaces to be connected, c) arranging the electronic component and the substrate appropriately such that the first surface of the electronic component to be connected and the second surface of the substrate to be connected contact each other by the solder paste, and d) soldering the arrangement from c) in order to generate a firmly-bonded connection between the electronic component and the substrate. The thickness of the applied layer of solder paste is at least 20 µm. The solder paste used in the method contains (i) 10-30% by weight (percent by weight) copper particles, (ii) 60-80% by weight particles made of at least one substance selected from the group consisting of tin and tin-copper alloys, and (iii) 3-30% by weight solder flux, wherein the mean particle diameter of the copper particles and of the particles made of at least one substance selected from the group consisting of tin and tin-copper alloys is ≤15 µm.

In the article "Standard-Reflowlöten für Anwendungen bis 300° C.—ein Widerspruch? Ergebnisse aus dem Verbundprojekt HotPowCon" published in DVS-Berichte, Elektronische Baugruppen and Leiterplatten EBL 2014 (ISBN 978-3-87155-573-2), A. Fix et al. report on a soldering method that utilizes two pastes that are applied separately, i.e., one paste containing copper particles and one paste containing a soldering metal particle.

The soldering connections produced according to the method according to WO 2011/009597 A1 attain good strength, but have proven to be improvable with respect to homogeneity and absence of hollow spaces and, ultimately, also with respect to reliability, in particular under high temperature conditions in the range of, for example, 250 to 300° C. during the development work on the present invention.

BRIEF SUMMARY OF THE INVENTION

The present invention therefore relates to a method for making a firmly-bonded connection of an electronic component to a substrate, comprising
   a) providing an electronic component having a first surface to be connected and a substrate having a second surface to be connected;
   b) applying a copper paste onto at least one of the surfaces to be connected and drying the layer of copper paste;
   c1) applying a solder agent onto the dried layer of copper paste and appropriately arranging the electronic component and the substrate such that the first surface of the electronic component to be connected and the second surface of the substrate to be connected contact each other by the two-layer combination of dried copper paste and solder agent;
   or
   c2) appropriately arranging the electronic component and the substrate such that the first surface of the electronic component to be connected and the second surface of the substrate to be connected contact each other by the dried copper paste, and applying a solder agent next to the layer of dried copper paste; and
   d) soldering the arrangement produced in c1) or c2) to generate a firmly-bonded connection between the electronic component and the substrate;
wherein the copper paste contains (i) 66-99% by weight of at least one type of particles that each comprise a phosphorus fraction of 0 to ≤500 wt-ppm and are selected from the group consisting of copper particles, copper-rich copper/zinc alloy particles, and copper-rich copper/tin alloy particles, (ii) 0-20% by weight of at least one type of solder particles selected from the group consisting of tin particles, tin-rich tin/copper alloy particles, tin-rich tin/silver alloy particles, and tin-rich tin/copper/silver alloy particles, and (iii) 1-20 percent by weight vehicle, whereby the mean particle diameter of metallic particles (i) and (ii) is ≤15 µm.

DETAILED DESCRIPTION OF THE INVENTION

Accordingly, a first embodiment of the invention is a method for making a firmly-bonded connection of an electronic component to a substrate, comprising
   a) providing an electronic component having a first surface to be connected and a substrate having a second surface to be connected;
   b) applying a copper paste onto at least one of the surfaces to be connected and drying the layer of copper paste;
   c) applying a solder agent onto the dried layer of copper paste and appropriately arranging the electronic component and the substrate such that the first surface of the electronic component to be connected and the second surface of the substrate to be connected contact each other by the two-layer combination of dried copper paste and solder agent; and
   d) soldering the arrangement produced in c) to generate a firmly-bonded connection between the electronic component and the substrate;
wherein the copper paste contains (i) 66-99% by weight of at least one type of particles that each comprise a phosphorus fraction of 0 to ≤500 wt-ppm and are selected from the group consisting of copper particles, copper-rich copper/zinc alloy particles, and copper-rich copper/tin alloy particles, (ii) 0-20% by weight of at least one type of solder particles selected from the group consisting of tin particles, tin-rich tin/copper alloy particles, tin-rich tin/silver alloy particles, and tin-rich tin/copper/silver alloy particles, and (iii) 1-20 percent by weight vehicle, wherein the mean particle diameter of metallic particles (i) and (ii) is ≤15 µm.

Accordingly, a second embodiment of the invention is a method for making a firmly-bonded connection of an electronic component to a substrate, comprising a) providing an electronic component having a first surface to be connected and a substrate having a second surface to be connected;
b) applying a copper paste onto at least one of the surfaces to be connected and drying the layer of copper paste;
c) appropriately arranging the electronic component and the substrate such that the first surface of the electronic component to be connected and the second surface of the substrate to be connected contact each other by the dried copper paste, and applying a solder agent next to the layer of dried copper paste; and
d) soldering the arrangement produced in c) to generate a firmly-bonded connection between the electronic component and the substrate;

wherein the copper paste contains (i) 66-99% by weight of at least one type of particles that each comprise a phosphorus fraction of 0 to ≤500 wt-ppm and are selected from the group consisting of copper particles, copper-rich copper/zinc alloy particles, and copper-rich copper/tin alloy particles, (ii) 0-20% by weight of at least one type of solder particles selected from the group consisting of tin particles, tin-rich tin/copper alloy particles, tin-rich tin/silver alloy particles, and tin-rich tin/copper/silver alloy particles, and (iii) 1-20 percent by weight vehicle, wherein the mean particle diameter of metallic particles (i) and (ii) is ≤15 µm.

In the scope of the invention, the term "electronic component" shall be understood to mean a component of an electrical and/or electronic circuit. The electronic component can be, for example, a chip, preferably a bare chip (semi-conductor chip) without housing, a semi-conductor diode, a transistor, a resistor or a capacitor.

In the scope of the invention, the term "substrate" shall be understood to mean a body to which the electronic component is connected. The substrate can be, for example, a printed circuit board, direct-bonded copper (DBC or DCB) or a lead frame.

The term "printed circuit board" is used herein as a synonym of printed circuit card, board or printed circuit and describes a carrier for electronic components. Printed circuit boards consist of electrically insulating material to which conductive connections adhere (printed conductors). Fiber-reinforced plastic material, for example, can be used as electrically insulating material.

Direct-bonded copper is a term used to refer to a ceramic plate (for example made of aluminum oxide, aluminum nitride or beryllium oxide), wherein one surface or the two surfaces with the largest surface area that are parallel to each other are bonded with copper through an oxidation process at high temperatures. At the selected conditions, a eutectic mixture of copper and oxygen is formed that becomes connected to both the copper and the substrate oxide.

A lead frame shall be understood to be an IC (integrated circuit, microchip) housing that essentially consists of a chip carrier and connecting leads only. The term "lead frame" is used herein as a synonym of the terms connecting frame and chip carrier. The chip carrier comprises a substrate that constitutes its base frame and is fabricated from metal, for example from copper, copper alloys, a combination of copper and a finisher (e.g., nickel, silver or gold), iron-nickel alloys or other invar alloys.

The electronic component comprises at least one first surface that is provided to connect the electronic component to a surface of the substrate by the contact layer produced by the two-layer combination of dried copper paste and solder agent in step c1) or by the dried copper paste in step c2). This surface can just as well be part of a larger surface.

The substrate comprises at least one second surface that is provided to connect the electronic component to a surface of the substrate by the contact layer produced by the two-layer combination of dried copper paste and solder agent in step c1) or by the dried copper paste in step c2). This surface also can just as well be part of a larger surface.

The surface of the electronic component that is connected to the substrate by the contact layer produced by the two-layer combination of dried copper paste and solder agent in step c1) or by the dried copper paste in step c2) is called "first surface to be connected," whereas the surface of the substrate that is connected to the electronic component by the corresponding contact layer is called "second surface to be connected."

Customarily, a metallization layer has been applied at least to the first surface of the electronic component to be connected. It is also customary for a metallization layer to have been applied at least to the second surface of the substrate to be connected. Customarily, both electronic component and substrate possess a metallization layer at least on the surfaces to be connected. It is therefore customary that the electronic component comprises a metallization layer on a surface that is situated opposite from a metallization layer on the surface of the substrate and that these metallization layers are connected to each other through the contact layer. In the scope of the invention, the metallization layers of the electronic component that are usually present are part of the electronic component and the metallization layers of the substrate that are usually present are part of the substrate.

The metallization layer, if present, preferably accounts for a fraction of the surface area of at least 50%, more preferably at least 70%, even more preferably at least 90%, and particularly preferably at least 95%, such as, for example, 100%, of at least one of the surfaces of the electronic component. On the substrate, the metallization layer preferably accounts for a fraction of the surface area of at least 50%, more preferably at least 70%, even more preferably at least 90%, and particularly preferably at least 95%, such as, for example, 100%, of the surface that is connected to the electronic component through the contact layer.

Preferably, the metallization layer is a solderable layer. The metallization layer preferably contains at least one element selected from the group consisting of copper, silver, gold, tin, and palladium. The metallization layer can consist entirely of these elements, solderable compounds of these elements, or mixtures or alloys of these elements.

In step b), the copper paste is applied to at least one of the surfaces of the electronic component or substrate that are to be connected, and dried.

Relative to its weight, the copper paste contains (i) 66-99% by weight, preferably 68-95% by weight, and more preferably 70-92% by weight of at least one type of particles that comprise a phosphorus fraction of 0 to ≤500 wt-ppm, for example >0 to ≤500 wt-ppm, preferably ≥0 to ≤100 wt-ppm, more preferably ≥0 to ≤50 wt-ppm, and, in particular, ≥0 to ≤10 wt-ppm, and are selected from the group consisting of copper particles, copper-rich copper/zinc alloy particles, and copper-rich copper/tin alloy particles, (ii) 0-20% by weight, preferably 5-15% by weight of at least one type of solder particles selected from the group consisting of tin particles, tin-rich tin/copper alloy particles, tin-rich tin/silver alloy particles, and tin-rich tin/copper/silver alloy particles, and (iii) 1-20% by weight, preferably 5-15% by weight, of vehicle, wherein the mean particle diameter of metallic particles (i) and (ii) is ≤15 µm.

Preferably, the copper paste consists of, relative to its weight, (i) 66-99% by weight, preferably 68-95% by weight, and more preferably 70-92% by weight of at least one type of particles that comprise a phosphorus fraction of 0 to ≤500 wt-ppm, for example >0 to ≤500 wt-ppm, preferably ≥0 to ≤100 wt-ppm, more preferably ≥0 to ≤50 wt-ppm, and, in particular, ≥0 to ≤10 wt-ppm and are selected from the group consisting of copper particles, copper-rich copper/zinc alloy particles, and copper-rich copper/tin alloy particles, (ii) 0-20% by weight, preferably 5-15% by weight of at least one type of solder particles selected from the group consisting of tin particles, tin-rich tin/copper alloy particles, tin-rich tin/silver alloy particles, and tin-rich tin/copper/silver alloy particles, and (iii) 1-20% by weight, preferably 5-15% by weight, of vehicle, wherein the mean particle diameter of metallic particles (i) and (ii) is ≤15 μm.

The purity of the copper of the copper particles contained in the copper paste is preferably at least 99.9% (3 N) and more preferably at least 99.99% (4 N). In the case of the particles made of copper-rich copper/zinc alloys and/or copper-rich copper/tin alloys, the composition is, for example, 60 to 99.5% by weight copper and, correspondingly, 0.5 to 40% by weight zinc and/or tin. In each case, the phosphorus fraction of all particles is 0 to ≤500 wt-ppm, for example >0 to ≤500 wt-ppm, preferably ≥0 to ≤100 wt-ppm, more preferably ≥0 to ≤50 wt-ppm, and, in particular, ≥0 to ≤10 wt-ppm. Preferably, the particles are particles produced by atomization in an inert gas atmosphere or, in other words, particles produced by atomization of liquid (molten) copper and/or melt of any of the specified copper alloys into an inert gas atmosphere.

As mentioned above, in an embodiment, the copper paste can contain at least one type of soldering metal particles (ii) selected from the group consisting of tin particles, tin-rich tin/copper alloy particles, tin-rich tin/silver alloy particles, and tin-rich tin/copper/silver alloy particles.

If the copper paste contains soldering metal particles made of tin-rich tin/copper, tin/silver and/or tin/copper/silver alloys, the tin fraction thereof preferably is in the range of 95-99.5% by weight, whereas the copper and/or silver fraction, accordingly, is in the range of 0.5-5% by weight.

The mean particle diameters of metallic particles (i) and (ii) are ≤15 μm, preferably ≤13 μm, more preferably ≤11 μm, and even more preferably ≤8 μm. Preferably, the mean particle diameter is in the range of 2-15 μm, more preferably in the range of 2-13 μm, even more preferably in the range of 2-11 μm, and yet even more preferably in the range of 2-8 μm.

The term "mean particle diameter" used herein means the mean particle size (d50) that can be determined with an optical microscope. Measurements of this type can be made with an optical microscope, for example at 200-fold magnification, in combination with a common digital image processing system (CCD digital camera and analytical software), for example with a measuring system from Microvision Instruments.

For example, a mean particle diameter of ≤15 μm can mean that at least 90 percent of the particles have a particle diameter≤15 μm and less than 10 percent of the particles have a particle diameter of more than 15 μm. Accordingly, a mean particle diameter being in the range of 2-15 μm means that at least 90 percent of the particles have a particle diameter in the range of 2-15 μm and less than 10 percent of the particles have a particle diameter of less than 2 μm or more than 15 μm.

It can be preferred according to the invention that less than 1 percent of particles (i) and (ii) exceed a certain particle diameter. The particle diameter that may be exceeded by less than 1 percent of particles (i) and (ii) is preferably 15 μm, more preferably 11 μm, and even more preferably 8 μm.

Particles (i) and (ii) can have different geometries. However, particles (i) and (ii) are preferably spherical in shape. However, it is obvious to a person skilled in the art that a minor fraction of particles (i) and (ii) employed presently can be non-spherical in shape for production reasons. However, it is preferred that at least 90% by weight, more preferably at least 95% by weight, even more preferably at least 99% by weight or 100% by weight of particles (i) and (ii) are present in spherical shape. It is also preferred that the copper paste contains less than 5% by weight, more preferably less than 1% by weight, even more preferably less than 0.1% by weight, for example 0% by weight, of particles (i) and (ii) in the shape of flakes.

In addition to the metal particles of type (i) and, if applicable, (ii), the copper paste comprises a so-called vehicle (iii), which comprises or consists of one or more, possibly modified, natural thickening agents (for example gelatin, starch, pectin, cellulose ether, esters of natural organic oils) and organic solvents (for example glycol, glycerol, terpineol, aliphatic hydrocarbons). The thickening agent fraction of the vehicle is, for example, 0.5-15% by weight, preferably 2-10 by weight, and more preferably 4-7% by weight, whereas the solvent fraction is 85-99.5% by weight, preferably 90-98% by weight, and more preferably 93-96% by weight.

The application of the copper paste in process step b) can be effected through any of the methods known according to the prior art, for example screen printing methods, stencil printing method, jet, or dispensing technique.

There is no need for the copper paste to cover the entire surface of the electronic component or substrate. Rather, the copper paste can just as well be applied just to parts of the surface of the electronic component or substrate, for example to selected soldering surfaces. The copper paste is being applied, for example, at a layer thickness of 20-200 μm, and then dried, for example for 10-60 minutes at an object temperature of 50-160° C. Then, process step c1) or c2) follows.

The solder agent used in process step c1) or c2) can be a solder paste or one or more solder molded parts made of soldering metal.

Referring to a solder agent in the form of a solder paste, the latter can contain, relative to its weight, (a) 80-99% by weight, preferably 85-95% by weight, and more preferably 87-92% by weight of at least one type of soldering metal particles selected from the group consisting of tin particles, tin-rich tin/copper alloy particles, tin-rich tin/silver alloy particles, and tin-rich tin/copper/silver alloy particles, and (b) 1-20% by weight, preferably 5-15% by weight, and more preferably 8-13% by weight, solder flux or vehicle. Preferably, the solder paste consists of, relative to its weight, (a) 80-99% by weight, preferably 85-95% by weight, and more preferably 87-92% by weight of at least one type of soldering metal particles selected from the group consisting of tin particles, tin-rich tin/copper alloy particles, tin-rich tin/silver alloy particles, and tin-rich tin/copper/silver alloy particles, and (b) 1-20% by weight, preferably 5-15% by weight, and more preferably 8-13% by weight, solder flux or vehicle.

If the solder paste contains soldering metal particles made of tin-rich tin/copper, tin/silver and/or tin/copper/silver alloys, the tin fraction thereof is preferably in the range of 95-99.5% by weight, whereas the copper and/or silver fraction, accordingly, is in the range of 0.5-5% by weight.

With regard to the mean particle diameters of the tin particles or tin-rich particles, the same shall apply as specified above with regard to the mean particle diameters of metal particles (i) and (ii).

If the solder paste contains solder flux, the solder flux should be capable of reducing the surface of the substrate and/or electronic component during the soldering process (i.e., to de-oxidize), prevent renewed oxide formation before and after the soldering process, and reduce the inclusion of foreign substances. Moreover, addition of the solder flux should reduce the surface tension of the liquid solder. For example, colophony, colophony-based resin systems, water-based resin systems or systems based on carboxylic acids (e.g., carboxylic acids such as citric acid, adipic acid, cinnamic acid, and benzylic acid), amines (e.g., tertiary amines), and solvents (e.g., polar solids containing water and a polyol such as glycol or glycerol) can be used as solder flux.

Moreover, the solder paste can contain further ingredients such as, for example, alcohols, fatty acids (e.g. saturated fatty acids, such as oleic acid, myristic acid, palmitic acid, margaric acid, stearic acid or eicosanoic acid), polysiloxane compounds or phosphide compounds.

As mentioned above, the solder paste can contain so-called vehicle instead of solder flux.

In order to avoid unnecessary repetition, reference shall be made to the information regarding the vehicle that has been provided above in the context of the description of the copper paste.

The application of the solder paste in process step c1) or c2) can be effected through any of the methods known according to the prior art, for example screen printing methods, stencil printing method or jet or dispensing technique. In the embodiment of the method according to the invention that comprises process step c1), the solder paste is applied onto the dried copper paste, whereas it is applied next to the dried copper paste in the embodiment that comprises process step c2). The procedure in the latter case can be such that the solder paste touches the dried copper paste from the side or is situated at a short distance of, for example, up to 2 mm from the dried copper paste; during the soldering in process step d) later on, the solder paste begins to flow and, supported by the capillary effect, infiltrates the dried copper paste matrix. The solder paste is being applied, for example, at a wet layer thickness of 20-200 µm, and then dried, if applicable, for example for 10-60 minutes at an object temperature of 50-160° C.

The solder agent in the form of at least one molded part made of soldering metal is, for example, a bead, foil, wire or cylinder. The molded parts are selected from the group consisting of tin molded parts, tin-rich tin/copper alloy molded parts, tin-rich tin/silver alloy molded parts, and tin-rich tin/copper/silver alloy molded parts. In the case of the tin-rich tin/copper, tin/silver and/or tin/copper/silver alloys, the tin fraction thereof is, for example, in the range of 95-99.5% by weight, whereas the copper and/or silver fraction, accordingly, is in the range of 0.5-5% by weight.

The application of the at least one soldering metal molded part usually consists of simply placing the part. In the embodiment of the method according to the invention that comprises process step c1), at least one soldering metal molded part is placed on the dried copper paste, whereas it is placed next to the dried copper paste in the embodiment that comprises process step c2). The procedure in the latter case can be such that the at least one soldering metal molded part touches the dried copper paste from the side or is situated at a short distance of, for example, up to 2 mm from the dried copper paste; during the soldering in process step d) later on, the at least one soldering metal molded part begins to flow and, supported by the capillary effect, infiltrates the dried copper paste matrix.

Neither the copper paste nor the solder agent contains lead and are therefore lead-free. In the scope of the invention, being lead-free shall be understood to mean that the copper paste and solder agent contain no lead except for contaminating lead that may possibly be present for technical reasons. Accordingly, lead-free shall be understood to mean a lead content of less than 1, preferably of less than 0.5, more preferably of less than 0.1, even more preferably of less than 0.01% by weight and in particular of 0% by weight, based on the weight of the copper paste and/or solder agent.

According to the invention, electronic component and substrate are connected to each other in a firmly-bonded manner through soldering. Accordingly, firmly-bonded connections are connections in which the connected partners are kept together through atomic or molecular forces. They are preferably non-separable connections that can be separated only by destroying the connecting means.

According to the invention, an arrangement consisting of the substrate, the electronic component and a two-layer combination of dried copper paste and solder agent situated between substrate and electronic component or consisting of the substrate, the electronic component and a layer of dried copper paste situated between substrate and electronic component with solder agent applied next to it is formed first. Accordingly, substrate and electronic component are arranged such that the first surface of the substrate to be connected and the second surface of the electronic component to be connected contact each other through the two-layer combination of dried copper paste and solder agent or through the dried copper paste with solder agent applied next to it.

Usually, this two-layer combination or the dried copper paste preferably contacts the metallization layer of the substrate, which is usually present, and the metallization layer of the electronic component, which is usually present.

In the embodiment of the method according to the invention that comprises process step c1), it is preferred to apply for this purpose, initially, as described above, a two-layer combination made of the dried copper paste and the solder agent onto the surface of the substrate to be connected, preferably onto the surface of the substrate comprising a metallization layer. Subsequently, a surface of the electronic component, preferably the surface comprising the metallization layer, is placed onto the two-layer combination made of the dried copper paste and the solder agent.

In the embodiment of the method according to the invention that comprises process step c2), it is preferred to apply for this purpose, initially, as described above, a layer of the dried copper paste onto the surface of the substrate to be connected, preferably onto the surface of the substrate comprising a metallization layer. Then, the solder agent is applied, as described above, next to the layer of dried copper paste. Subsequently, a surface of the electronic component, preferably the surface comprising the metallization layer, is placed on the dried copper paste.

In both alternatives of the method according to the invention, i.e., in the embodiment of the method according to the invention comprising process step c1) as well as the one comprising process step c2), process step d) involves lastly soldering the arrangement of electronic component, substrate, and two-layer combination made of dried copper paste and solder agent situated in between and/or layer of dried copper paste with solder agent applied next to it (i.e., having the solder agents touch the dried copper paste from the side or be situated at a short distance of, for example, up to 2 mm from the dried copper paste) while forming an arrangement of electronic component, substrate, and contact layers situated in between. According to general definition, soldering shall be understood to mean a thermal method for firmly-bonded joining of materials without reaching the solidus temperature of the materials.

For soldering, the arrangement described above is heated, preferably evenly until the actual soldering temperature is reached. According to a preferred embodiment, the heating proceeds at a rate of ≤3° C. per second.

Preferably, the soldering temperature is approx. 10-50° C., more preferably approx. 15-45° C., and even more preferably 25-35° C., for example approx. 30° C., above the melting temperature of the soldering metal contained in the solder agent. According to another preferred embodiment, the soldering temperature is below 280° C., for example in the range of 240-260° C.

For soldering, the temperature is kept above the liquidus temperature of the soldering metal contained in the solder agent for a period of at least 15 seconds, preferably of at least 20 seconds, and even more preferably of at least 30 seconds.

Presumably, the cooling of the soldered arrangement to below the liquidus temperature of the soldering metal of the solder agent is associated with diffusion of the copper originating from the particles (i) of the copper paste into the eutectic tin-copper phase that has been generated during the soldering process.

It can be advantageous to subject the arrangement made up of electronic component, substrate, and intervening contact layer that is obtained during the soldering process to a heat treatment following the soldering process. Heat treatment shall be understood to mean treating the arrangement with heat below the liquidus temperature of the solder.

The heat treatment preferably proceeds at a temperature above 40° C., for example in the range of 40-217° C., more preferably in the range of 100-210° C., and even more preferably in the range of 150-205° C. The heat treatment preferably proceeds for a duration of 1 minute to 24 hours, more preferably for 10 minutes to 10 hours, and even more preferably for 20 minutes to 1 hour. The duration of heat treatment is usually correlated with the temperature and the longer the duration, the lower the temperature used for heat treatment.

The method according to the invention necessitates no expensive modifications to be made to the customary methods for the production of arrangements made up by electronic component, substrate, and intervening contact layer. In particular, the method according to the invention is not associated with particular requirements regarding the machinery used for conventional soldering processes. The method according to the invention can therefore be carried out, for example, at conventional conditions and using existing machinery, if any.

According to a preferred embodiment, the arrangement according to the invention can be or is produced by the method described above.

The distance between electronic component and substrate in the arrangement according to the invention is, for example, 20 to 200 μm. This distance shall be understood to be the distance between the surfaces of electronic component and substrate that are to be connected, wherein the metallization layers, which are usually present, are part of the electronic component and/or substrate. This distance thus corresponds to the thickness of the contact layer between electronic component and substrate, i.e., after soldering.

According to the invention, the soldering conditions, thickness of the applied layer of copper paste, the mound and/or thickness of the applied layer of the solder agent, temperature and time, and, if applicable, the heat treatment conditions, in particular temperature and time, can be adjusted appropriately in the soldering process described above such that the contact layer described above is attained. The formation of the contact layer having the desired properties can be traced easily through analysis of corresponding microsections.

EXAMPLES

Inventive Example 1

A copper paste was prepared that comprised 91% by weight copper particles having a mean particle diameter of 8 μm and a phosphorus fraction of 5 wt-ppm and contained 9% by weight of a vehicle (ethyl cellulose in an organic solution).

The copper paste was applied through a metal template onto a copper sheet. The thickness of the applied layer of copper paste was 80 μm. Subsequently, the surface of the copper sheet provided with the copper paste was configured, by machine, with a bare chip sized 3 mm×3 mm that comprised a metallization layer made of nickel/silver. For this purpose, the bare chip was placed appropriately on the copper paste such that the metallization layer of the bare chip contacted the copper sheet via the copper paste. A solder molded part (soldering wire made of SnAg3.0Cu0.5 alloy with a diameter of 0.5 mm and a length of 3 mm) was applied onto the copper sheet right next to this arrangement.

Then, this arrangement of copper sheet, bare chip, copper paste situated in between, and solder molded part applied to it was placed in a chamber soldering furnace, heated at a rate of 0.5 Kelvin per second to a temperature of 60° C. and dried at this temperature for 1 h in an inert gas atmosphere. Immediately afterwards, the temperature was increased to 200° C. and the reaction surfaces, i.e., of the solder molded part, of the copper particles in the intervening layer made of dried copper paste, and of the copper sheet surface, were activated/reduced by means of a formic acid-saturated nitrogen atmosphere. Then, the temperature was increased to 260° C. in the same soldering furnace and said arrangement was soldered in a vacuum (1 mbar) for a soldering time of 10 min.

Inventive Example 2

The procedure was the same as in Example 1 with the sole exception being that the phosphorus fraction of the copper particles was 500 wt-ppm.

Reference Example 3

The procedure was the same as in Example 1 with the sole exception being that the phosphorus fraction of the copper particles was 1100 wt-ppm.

Reference Example 4

Similar to Example 1, a similar arrangement was produced; but this was done without using a copper paste.

In accordance with the bare chip size of 3 mm×3 mm, a solder molded part in the form of a sheet with a thickness of 0.1 mm was produced from the SnAg3.0Cu0.5 alloy and applied to the copper sheet and the bare chip was placed on it. This arrangement was soldered as in Example 1, though without the drying step described therein, at the same activation parameters and reduced soldering temperature of 240° C.

In various tests of the stability of the soldered connections and/or soldered arrangements produced according to Examples 1 to 4, it was evident that the soldered connections of the arrangements produced in accordance with Inventive examples 1 and 2 showed significantly higher shear strength at 200° C. than the arrangements produced in accordance with Reference example 3 or in accordance with Reference example 4.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

The invention claimed is:

1. A method for making a firmly-bonded connection of an electronic component to a substrate, comprising
   a) providing an electronic component having a first surface to be connected and a substrate having a second surface to be connected;
   b) applying a copper paste onto at least one of the surfaces to be connected and drying the layer of copper paste;
   c1) applying a solder agent onto the dried layer of copper paste and arranging the electronic component and the substrate such that the first surface of the electronic component to be connected and the second surface of the substrate to be connected contact each other by the two-layer combination of dried copper paste and solder agent;
   or
   c2) arranging the electronic component and the substrate such that the first surface of the electronic component to be connected and the second surface of the substrate to be connected contact each other by the dried copper paste, and applying a solder agent next to the layer of dried copper paste; and
   d) soldering the arrangement produced in c1) or c2) to generate a firmly-bonded connection between the electronic component and the substrate;
   wherein step c1) or step c2) directly follows step b) with no intervening step; and
   wherein the copper paste contains (i) 66-98% by weight of a first type of particles each comprising a phosphorus fraction of >0 to ≤500 wt-ppm and selected from the group consisting of copper particles, copper-rich copper/zinc alloy particles, and copper-rich copper/tin alloy particles, ii) 1-20% by weight of a second type of particles selected from the group consisting of tin particles, tin-rich tin/copper alloy particles, tin-rich tin/silver alloy particles, and tin-rich tin/copper/silver alloy particles, wherein the second type of particles contain no phosphorus, and (iii) 1-20 percent by weight vehicle, wherein the mean particle diameter of metallic particles (i) and (ii) is ≤15 μm.

2. The method according to claim 1, wherein the phosphorus fraction in the first type of particles is >0 to ≤100 wt-ppm.

3. The method according to claim 1, wherein the composition of the copper-rich copper/zinc alloys or copper-rich copper/tin alloys is 60 to 99.5% by weight copper and 0.5 to 40% by weight zinc or tin.

4. The method according to claim 1, wherein the particles of type (i) are produced by atomization in an inert gas atmosphere.

5. The method according to claim 1, wherein the composition of the tin-rich tin/copper alloys, tin/silver alloys or tin/copper/silver alloys is 95-99.5% by weight tin and 0.5-5% by weight copper, silver or copper plus silver.

6. The method according to claim 1, wherein the vehicle comprises 0.5-15% by weight of one or more, optionally modified, natural thickening agent and 85-99.5% by weight organic solvent.

7. The method according to claim 1, wherein the solder agent used in process step c1) or c2) is a solder paste or one or more solder molded parts made of soldering metal.

8. The method according to claim 1, wherein the solder agent in process step c2) is applied next to the dried copper paste such that it touches the dried copper paste from the side or is situated at a short distance of up to 2 mm from the dried copper paste.

9. The method according to claim 1, wherein the electronic component is a chip, a semiconductor diode, a transistor, a resistor or a capacitor.

10. The method according to claim 1, wherein the substrate is a printed circuit board, a direct-bonded copper or a lead frame.

11. The method according to claim 1, wherein the copper paste is applied by a screen printing method, a stencil printing method, jet or a dispensing technique.

12. The method according to claim 7, whereby the solder paste is applied by a screen printing method, a stencil printing method, jet or a dispensing technique.

13. The method according to claim 1, wherein the soldering temperature is in a range of 240-260° C.

14. The method according to claim 1, wherein the arrangement obtained after completion of step d) is heat-treated at a temperature in a range of 40-217° C. for a period of 1 minute up to 24 hours.

15. A bonded connection according to the method of claim 1.

* * * * *